(12) United States Patent
Lee et al.

(10) Patent No.: US 9,378,802 B2
(45) Date of Patent: Jun. 28, 2016

(54) OSCILLATOR AND MEMORY DEVICE INCLUDING THE SAME

(71) Applicant: SK hynix Inc., Gyeonggi-do (KR)

(72) Inventors: Hyeng-Ouk Lee, Gyeonggi-do (KR); Seung-Chan Kim, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 14/542,082

(22) Filed: Nov. 14, 2014

(65) Prior Publication Data
US 2015/0371699 A1    Dec. 24, 2015

(30) Foreign Application Priority Data

Jun. 18, 2014 (KR) .................. 10-2014-0074188
Aug. 14, 2014 (KR) .................. 10-2014-0105651

(51) Int. Cl.
G11C 7/06      (2006.01)
G11C 11/406    (2006.01)
H03L 1/02      (2006.01)
G11C 7/22      (2006.01)

(52) U.S. Cl.
CPC .......... *G11C 11/40626* (2013.01); *G11C 7/222* (2013.01); *G11C 11/40615* (2013.01); *H03L 1/022* (2013.01)

(58) Field of Classification Search
CPC ...... G11C 7/1006; G11C 7/14; G11C 11/406; G11C 11/40615
USPC .................... 365/222, 189.07, 149
See application file for complete search history.

(56) References Cited

U.S. PATENT DOCUMENTS

2005/0110592 A1* 5/2005 Lee .................. G11C 5/147
                                                   333/16

FOREIGN PATENT DOCUMENTS

KR    1020040013388    2/2004
KR    1020060000097    1/2006

* cited by examiner

*Primary Examiner* — Huan Hoang
(74) *Attorney, Agent, or Firm* — IP&T Group LLP

(57) ABSTRACT

An oscillator includes a comparison means suitable for generating a comparison signal by comparing an internal voltage of an internal node with a reference voltage; an inverting unit suitable for inverting the comparison signal and transmitting the inverted comparison signal to an output node; a pull-up driving unit suitable for pull-up driving the internal node in response to the voltage of the output node; a discharge unit suitable for discharging the internal node; and a gate coupled between the internal node and the discharge unit, and turned on/off in response to the voltage of the output node, wherein at least part of a capacitive load included in the oscillator is electrically coupled to the internal node.

17 Claims, 10 Drawing Sheets

OSCILLATOR AND MEMORY DEVICE INCLUDING THE SAME

CROSS-REFERENCE TO RELATED APPLICATIONS

The present application claims priority of Korean Patent Applications No. 10-2014-0074188, filed on Jun. 18, 2014, and No. 10-2014-0105651, filed on Aug. 14, 2014, which are incorporated herein by reference in their entirety.

BACKGROUND

1. Field

This patent document relates to an oscillator and a memory device including the same.

2. Description of the Related Art

Circuits such as memory devices, integrated-circuit (IC) chips, micro-controllers, and pump circuits use periodic signals for internal circuit operations. These periodic signals are generated by an oscillator and allow for synchronization of memory device operations.

The periodic signal of an oscillator has a period that varies according to the operating environment of the oscillator. Operating environments may change due to changes in temperature or operating voltages. To respond to these changes and optimize performance, the periodic signal may be adjusted to suit the given operating environment.

A memory device refresh operation is an example in which adjusting the oscillators periodic signal may improve performance. Memory cells of a memory device include a transistor serving as a switch and a capacitor for storing a charge (data). Whether a charge is stored in the capacitor of the memory cell, that is, whether the terminal voltage of the capacitor is high or low, indicates if the data point being stored is high (logic 1) or low (logic 2).

Since data is stored as an electric charge in a capacitor, no power is consumed in principle. However, since the initial electric charge stored in the capacitor diminishes due to leakage current caused by the PN Junction of an MOS transistor, or the like, data may be lost. In order to prevent such data loss, data stored in the memory cells must be read before the data is lost, and the capacitor must be recharged according to the information that was read. This recharging operation must be periodically repeated to retain stored data in a process that is known as a refresh operation.

Refresh operations include self-refresh operations that are performed in the memory device itself. Self-refresh operations may have optimized period signals that are adjusted according to charge retention time. For example, when the retention time is long (low temperature), the refresh period may be lengthened to reduce current consumption, and when the retention time is short (high temperature), the refresh period may be shortened to minimize the possibility of data loss.

The oscillator may be used to adjust the refresh period of the memory device. The oscillator may generate periodic signals that vary according to temperature. In order to prevent data loss and minimize power consumption, the period of the periodic signals needs to be precisely adjusted to suit the temperature in which the memory device is operating.

SUMMARY

Various embodiments are directed to an oscillator capable of blocking capacitance generated by internal components of a circuit, and generating a periodic signal precisely oscillating at a period according to temperature.

Also, various embodiments are directed to a memory device capable of minimizing power consumption while optimizing a self-refresh period according to temperature by using the above-described oscillator.

In an embodiment, an oscillator may include: a comparison means suitable for generating a comparison signal by comparing an internal voltage of an internal node with a reference voltage; an inverting unit suitable for inverting the comparison signal and transmitting the inverted comparison signal to an output node; a pull-up driving unit suitable for pull-up driving the internal node in response to the voltage of the output node; a discharge unit suitable for discharging the internal node; and a gate coupled between the internal node and the discharge unit, and turned on/off in response to the voltage of the output node wherein at least part of a capacitive load included in the oscillator is electrically coupled to the internal node.

In an embodiment, an oscillator may include: a comparison means suitable for generating a comparison signal by comparing an internal voltage of an internal node with a reference voltage; an inverting unit suitable for inverting the comparison signal and transmitting the inverted comparison signal to an output node; a pull-up driving unit suitable for pull-up driving the internal node in response to the voltage of the output node; a selecting unit suitable for generating a control signal in response to select information and the voltage of the output node; a plurality of discharge units each operative in response to the control signal, and suitable for discharging the internal node; and a plurality of gate units coupled between the internal node and corresponding discharge unit among the plurality of discharge units, and turned on/off in response to the control signal wherein at least part of a capacitive load included in the oscillator is electrically coupled to the internal node.

In an embodiment, a memory device may include: a cell array comprising a plurality of memory cells; a first signal generation unit suitable for generating a first signal having a fixed period; a second signal generation unit suitable for generating a second signal having a variable period; and a control unit suitable for refreshing the memory cells according to a shorter one between the fixed and variable periods in a self-refresh mode. The second signal generation unit may include: a plurality of discharge units suitable for discharging an internal node; and a plurality of gate units electrically coupled between the internal node and the plurality of discharge units, respectively, and each operative according to the second signal when a corresponding one among the plurality of discharge units is selected, wherein the variable period corresponds to a speed at which the internal node is discharged by the selected one among the plurality of discharge units, wherein at least part of a capacitive load included in the oscillator is electrically coupled to the internal node.

In an embodiment, an oscillator may include: a comparison means suitable for generating a comparison signal by comparing an internal voltage of an internal node with a reference voltage; an inverting unit suitable for inverting the comparison signal and transmitting the inverted comparison signal to an output node; a pull-up driving unit suitable for pull-up driving the internal node in response to the voltage of the output node; and a plurality of discharge units suitable for discharging the internal node when selected, wherein at least part of a capacitive load included in the oscillator is electrically coupled to the internal node.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1:
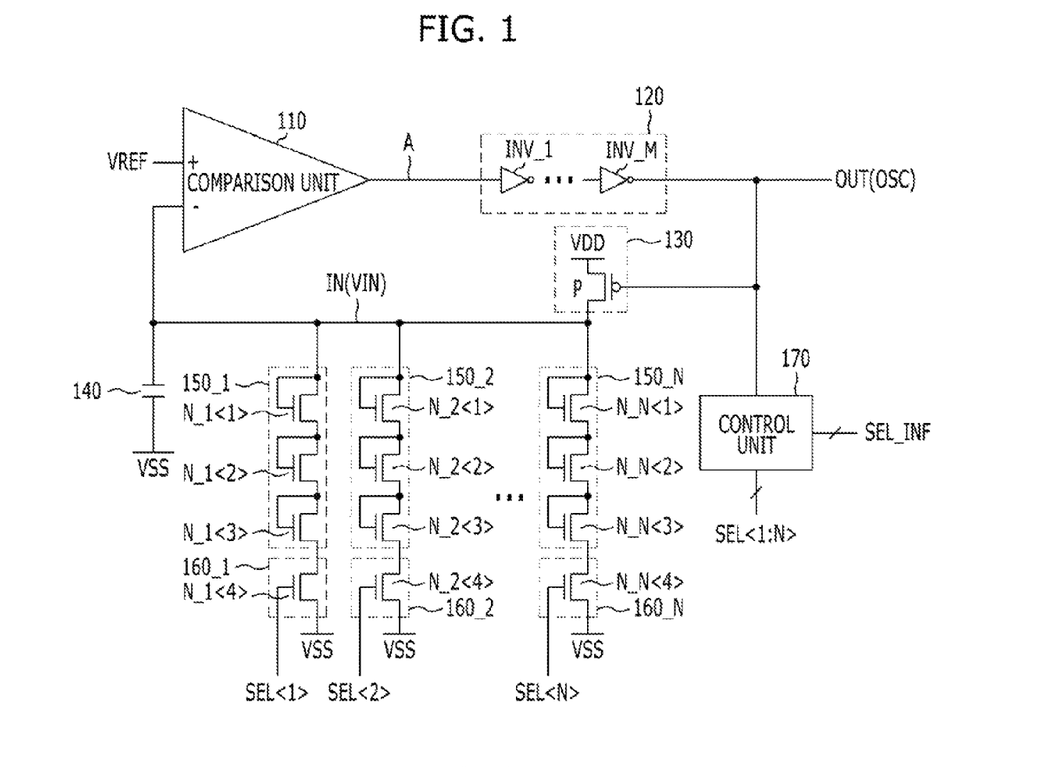
FIG. 1 is a circuit diagram illustrating an oscillator.

FIG. 1 is a circuit diagram illustrating an oscillator.

As illustrated in FIG. 1, the oscillator includes a comparison unit 110, an inverting unit 120, a pull-up driving unit 130, a capacitor 140, a plurality of discharge units 150-1 to 150-N, a plurality of coupling units 160_1 to 160_N, and a control unit 170.

The comparison unit 110 compares a reference voltage VREF and the voltage of an internal node IN (hereafter, referred to as an internal voltage VIN), and outputs the comparison result A. The comparison result A is a signal having a high level when the level of the reference voltage VREF is higher than the level of the internal voltage VIN, and is a signal having a low level when the level of the internal voltage VIN is higher than the level of the reference voltage VREF.

The inverting unit 120 inverts, delays, and outputs the comparison result A of the comparison unit 110 to an output node OUT. The inverting unit 120 includes an odd number of inverters INV_1 to INV_M coupled in series. The inverting unit 120 has a delay value which is adjusted according to the number of inverters INV_1 to INV_M. When the number of inverters INV_1 to INV_M is increased, the delay value of the inverting unit 120 is also increased, and when the number of inverters INV_1 to INV_M is decreased, the delay value of the inverting unit 120 is also decreased. The voltage of the output node OUT has the opposite value of the output signal of the comparison unit 110. When the comparison result A of the comparison unit 110 transitions from the low level to the high level, the voltage of the output node OUT transitions from the high level to the low level after a time elapse corresponding to the delay value of the inverting unit 120. Furthermore, when the comparison result A of the comparison unit 110 transitions from the high level to the low level, the voltage of the output node OUT transitions from the low level to the high level after a time elapse corresponding to the delay value of the inverting unit 120.

The pull-up driving unit 130 pull-up drives the internal node IN to a power supply voltage VDD in response to the voltage of the output node OUT. The pull-up driving unit 130 includes a PMOS transistor P coupled to the internal node IN at one end thereof and to the power supply voltage VDD at the other end thereof, and is turned on/off in response to the voltage of the output node OUT. The pull-up driving unit 130 is turned off when the voltage of the output node OUT is at the high level, and is turned on when the voltage of the output node OUT is at the low level and pull-up drives the internal node IN to the power supply voltage VDD.

The capacitor 140 is coupled to the Internal node IN, and stores electric charges transferred from the pull-up driving unit 130. The capacitor 140 represents the sum of capacitance comprising designed and parasitic capacitance electrically coupled to the internal node IN.

The plurality of discharge units 150_1 to 150_N is coupled to the internal node IN. When one of the discharge units 150_1 to 150_N is selected, the selected one of the discharge units 150_1 to 150_N discharges the capacitor 140 through the internal node IN. Each of the discharge units 150_1 to 150_N includes one or more transistors N_1<1:3> to N_N<1:3> coupled in series. Each of the transistors N_1<1:3> to N_N<1:3> is a NMOS transistor serving as a diode having a drain and a gate coupled to each other.

The discharge units 150_1 to 150N are coupled to the plurality of coupling units 160_1 to 160_N, respectively. The coupling units 160_1 to 160_N are coupled to a ground voltage VSS, and turned on/off in response to a plurality of select signals SEL<1:N>, respectively. The plurality of coupling units 160_1 to 160_N includes NMOS transistors N_1<4> to N_N<4> coupled to corresponding discharge units 150_1 to 150_N at one end and to the ground voltage VSS, respectively. The NMOS transistors N_1<4> to N_N<4> are turned on/off in response to the plurality of select signals SEL<1:N>, respectively.

The control unit 170 selects all or part of the plurality of discharge units 150_1 to 150_N in response to select information SEL_INF, and generates the plurality of select signals SEL<1:N> to turn on/off the plurality of coupling units 160_1 to 160_N, respectively, in response to the voltage of the output node OUT. For example, when the voltage of the output node OUT is at the low level, the control unit 170 generates the select signals SEL<1:N> to turn off all of the coupling units 160_1 to 160_N, regardless of whether a corresponding one of the plurality of discharge units 150_1 to 150_N is selected. That is, the control unit 170 disables all of the select signals SEL<1:N>. Furthermore, when the voltage of the output node OUT is at the high level, the control unit 170 generates the select signals SEL<1:N> to turn on one or more of the plurality of coupling units 160_1 to 160_N corresponding to the selected one or more of the plurality of discharge units 150_1 to 150_N. That is, the control unit 170 enables the select signal SEL<1> and disables the select signals SEL<2:N>.

Based on the above-described configuration, the operation of the oscillator to generate a periodic signal OSC will be described. The oscillator generates a periodic signal OSC having a predetermined period at the output node OUT. Hereafter, the case in which one discharge unit 150_1 among the plurality of discharge units 150_1 to 150_N is selected will be taken as an example.

When the reference voltage VREF is higher than the internal voltage VIN, the comparison unit 110 outputs a signal having a high level as the comparison result A, and the voltage of the output node OUT becomes a low level. Since the period signal OSC is at the low level, the pull-up driving unit 130 is turned on, and the control unit 170 disables all the select signals SEL<1:N> to the low level to turn off all of the coupling units 160_1 to 160_N. Since all of the discharge units 150_1 to 150_N are deactivated, the internal voltage VIN gradually increases as the capacitor 140 is charged by the pull-up driving unit 130.

When the internal voltage VIN becomes higher than the reference voltage VREF, the output signal of the comparison unit 110 transitions from the high level to the low level and the periodic signal OSC transitions from the low level to the high level after a predetermined time has elapsed. Thus, the pull-up driving unit 130 is turned off, and the control unit 170 enables the select signal SEL<1> to the high level to turn on the coupling unit 160_1 corresponding to the selected discharge unit 150_1, and disables the other select signals SEL<2:N>. Then, while the capacitor 140 is discharged through the selected discharge unit 150_1 and the selected coupling unit 160_1, the internal voltage VIN gradually decreases.

When the internal voltage VIN becomes lower than the reference voltage VREF, the output signal of the comparison unit 110 transitions from the low level to the high level and the periodic signal OSC transitions from the high level to the low level after a predetermined time has elapsed. Thus, the pull-up driving unit 130 is turned on, and the level of the internal voltage VIN increases in the same manner as described above. As such, the level of the periodic signal OSC oscillates according to the magnitude relation between the internal voltage VIN and the reference voltage VREF. The period of the periodic signal OSC varies depending on the delay value of the inverting unit 120, the charge speed of the capacitor 140, and the discharge speed of the discharge units 150_1 to 150_N.

In particular, the period of the periodic signal OSC becomes shorter as the discharge speed of the discharge units 150_1 to 150_N increases, and becomes longer as the discharge speed of the discharge units 150_1 to 150_N decreases. The discharge ability of the discharge units 150_1 to 150_N is improved as the temperature increases, and degraded as the temperature decreases. Thus, the period of the periodic signal OSC generated by the oscillator of FIG. 1 is adjusted according to the temperature.

Furthermore, since the discharge speed of the capacitor 140 varies depending on the number of selected ones among the plurality of discharge units 150_1 to 150_N, the period of the periodic signal OSC is adjusted according to the number of selected discharge units. For example, when the number of selected discharge units is increased, the period of the periodic signal OSC becomes shorter, and when the number of selected discharge units is decreased, the period of the periodic signal OSC becomes longer.

Figure 2:
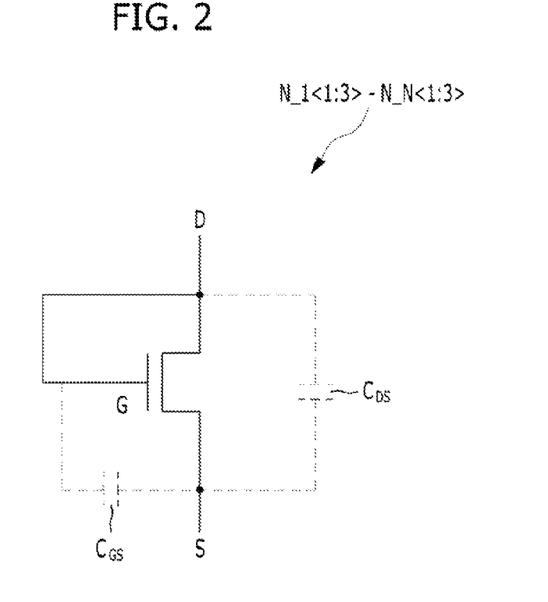
FIG. 2 is a circuit diagram illustrating a transistor included in an oscillator shown in FIG. 1.

FIG. 2 is a circuit diagram illustrating a transistor included in an oscillator shown in FIG. 1.

As illustrated in FIG. 2, parasitic capacitances $C_{DS}$ and $C_{GS}$ exist between the drain D and the source S and between the gate G and the source S in each of the transistors N_1<1:3> to N_N<1:3> included in each of the discharge units 150_1 to 150_N. The parasitic capacitances $C_{DS}$ and $C_{GS}$ delay the charging of the capacitor 140. Furthermore, the parasitic capacitances $C_{DS}$ and $C_{GS}$ of an unselected one among the plurality of discharge units 150_1 to 150_N delays the discharging of the capacitor 140, which is performed by a selected one among the plurality of discharge units 150_1 to 150_N. That is, the charging and discharging of the capacitor 140 are delayed by the parasitic capacitances $C_{DS}$ and $C_{GS}$ existing in the discharge units 150_1 to 150_N, and the period of the periodic signal OSC due to the parasitic capacitances $C_{DS}$ and $C_{GS}$ becomes longer than the expected or intended period.

Figure 3:
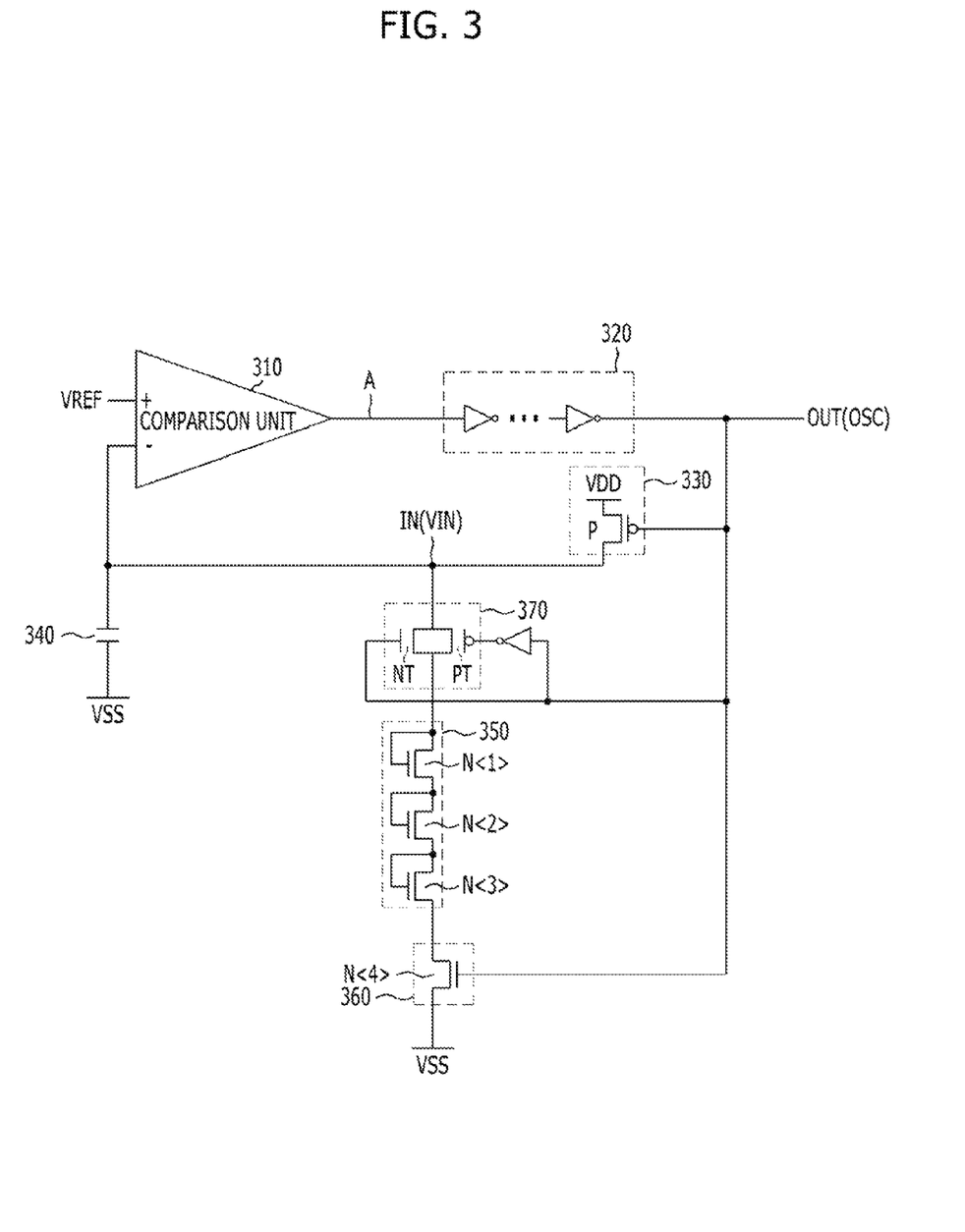
FIG. 3 is a circuit diagram illustrating an oscillator in accordance with an exemplary embodiment of the present invention.

FIG. 3 is a circuit diagram illustrating an oscillator in accordance with an exemplary embodiment of the present invention.

As illustrated in FIG. 3, the oscillator may include a comparison unit 310, an inverting unit 320, a pull-up driving unit 330, a capacitor 340, a discharge unit 350, a coupling unit 360, and a pass gate 370.

The oscillator shown in FIG. 3 may be the same as the oscillator described above with reference to FIG. 1 except for the pass gate 370.

The oscillator of FIG. 3 may include only one discharge unit 350 and the pass gate 370 coupled between the discharge unit 350 and an internal node IN. The pass gate 370 may electrically isolate the discharge unit 350 from the internal node IN when the discharge unit 350 does not discharge the capacitor 340. The pass gate 370 may include an NMOS transistor NT and a PMOS transistor PT. The PMOS transistor PT and the NMOS transistor NT may be electrically coupled in parallel between the internal node IN and the discharge unit 350.

The coupling unit 360 and the pass gate 370 may be turned off when the voltage of the output node OUT is at the low level, and turned on when the voltage of the output node OUT is at the high level. For reference, a periodic signal OSC may be generated at the output node OUT. When the pass gate 370 is turned off, the pass gate 370 may electrically isolate the discharge unit 350 such that electric current does not flow into the discharge unit 350, thereby preventing the influence of parasitic capacitances of transistors N<1:3>, which are included in the discharge unit 350, on the period of the periodic signal OSC.

When the pass gate 370 includes both of the NMOS and PMOS transistors as Illustrated in FIG. 3, it is more effective than when the pass gate 370 includes only one of the NMOS and PMOS transistors. The internal voltage VIN may toggle between the low level and the high level. Therefore, the internal node IN and the discharge unit 350 are effectively isolated from each other by the NMOS transistor NT when the internal voltage VIN is at the low level, or by the PMOS transistor when the internal voltage VIN is at the high level.

The oscillator of FIG. 3 may effectively block the influence of the parasitic capacitance of the discharge unit 350 on the period of the periodic signal OSC such that the periodic signal OSC has a precise period according to the temperature change as intended. In particular, the periodic signal OSC may have a shorter period at a specific temperature.

Figure 4:
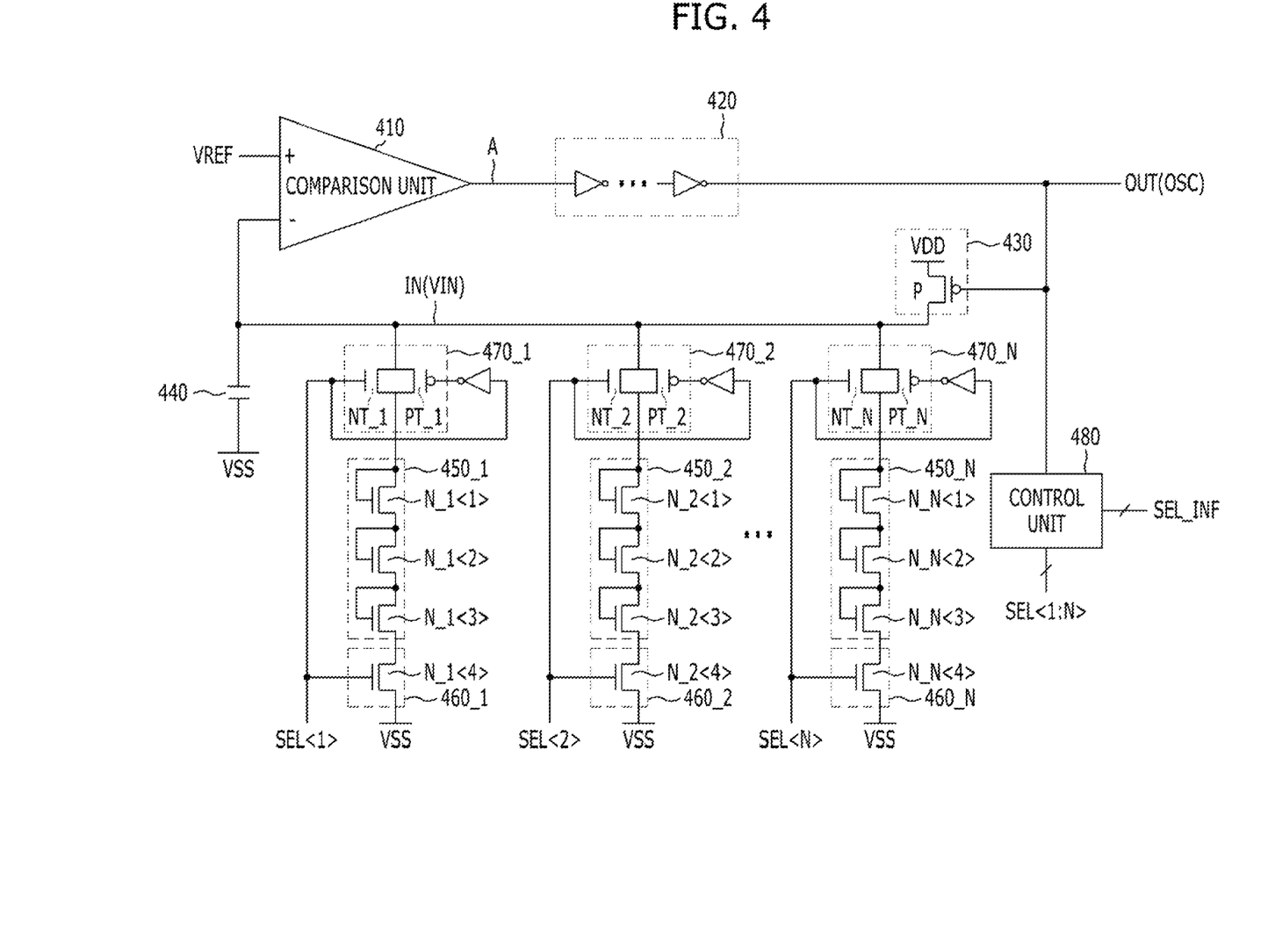
FIG. 4 is a circuit diagram illustrating an oscillator in accordance with an exemplary embodiment of the present invention.

FIG. 4 is a circuit diagram illustrating an oscillator in accordance with an exemplary embodiment of the present invention.

As illustrated in FIG. 4, the oscillator may include a comparison unit 410, an inverting unit 420, a pull-up driving unit 430, a capacitor 440, a plurality of discharge units 450_1 to 450_N, a plurality of coupling units 460_1 to 460_N, a plurality of pass gates 470_1 to 470_N, and a control unit 480.

The oscillator of FIG. 4 may be the same as the oscillator described with reference to FIG. 1 except for the plurality of pass gates 470_1 to 470_N coupled between an internal node IN and the plurality of discharge units 450_1 to 450_N, respectively.

Each of the plurality of pass gates 470_1 to 470_N may be the same as the pass gate 370 described above with reference to FIG. 3 except for the control signal thereof. The pass gates 470_1 to 470_N may be turned on/off by select signals SEL<1:N>, respectively. The select signals SEL<1:N> may also control turn-on/off of the coupling units 460_1 to 460_N, respectively. The pass gates 470_1 to 470_N may include N number of pairs of NMOS transistors NT_1 to NT_N and PMOS transistors PT_1 to PT_N, respectively. Each pair of the PMOS transistors PT_1 to PT_N and the NMOS transistors NT_1 to NT_N may be electrically coupled in parallel between the internal node IN and a corresponding one of the plurality of discharge units 450_1 to 450_N.

The pass gates 470_1 to 470_N may isolate unselected ones among the plurality of discharge units 450_1 to 450_N such that no electric current flows into the unselected discharge unit. Thus, when the capacitor 440 is charged or discharged through a selected one among the plurality of discharge units 450_1 to 450_N, the parasitic capacitance included in the plurality of discharge units 450_1 to 450_N may not affect the charge/discharge speed. Without the plurality of pass gates 470_1 to 470_N, when the capacitor 440 is charged, the parasitic capacitances of all the discharge units 450_1 to 450_N may affect the charge speed, and when the capacitor 440 is discharged, the parasitic capacitances of unselected discharge units may affect the discharge speed.

The oscillator of FIG. 4 may effectively block the influence of the parasitic capacitances of the discharge units 450_1 to 450_N on the period of the periodic signal OSC such that the periodic signal OSC has a precise period according to the temperature change as intended. In particular, the periodic signal OSC may have a shorter period at a specific temperature.

Figure 5:
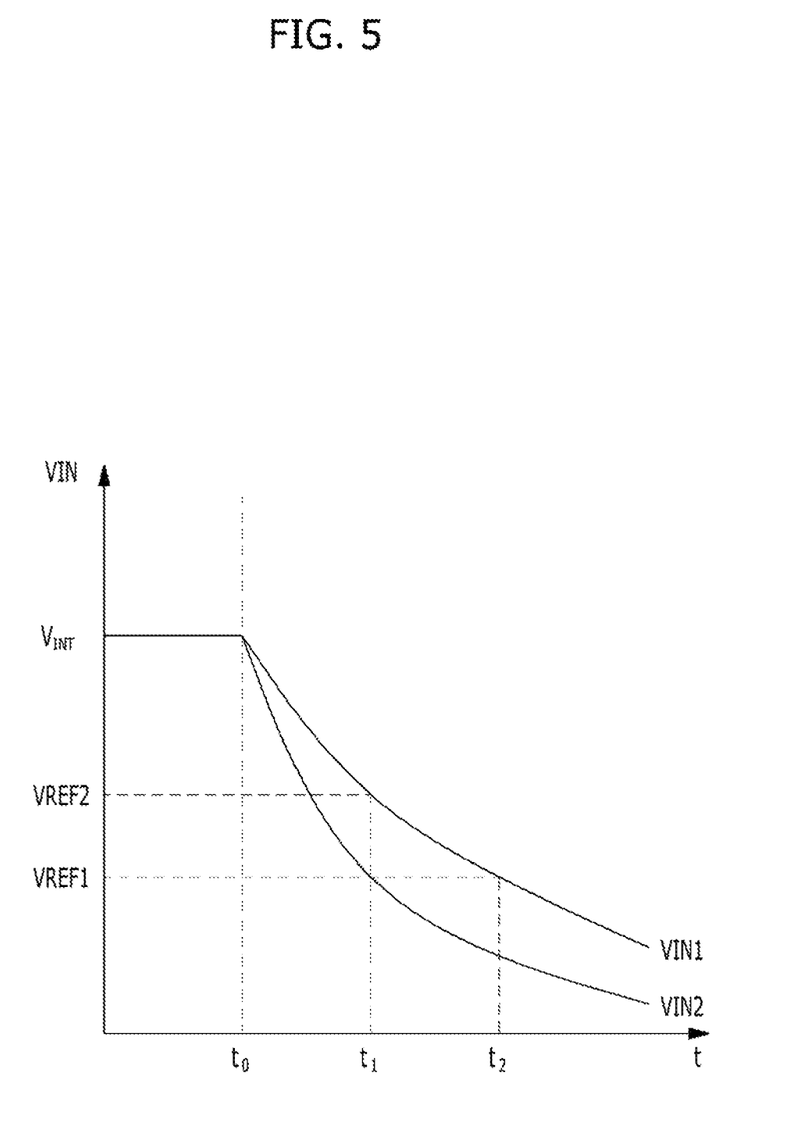
FIG. 5 is a time vs. internal voltage graph illustrating the behavior of oscillators shown in FIGS. 1 and 4.

FIG. 5 is a time vs. internal voltage graph Illustrating oscillators respectively shown in FIGS. 1 and 4. FIG. 5 illustrates the internal voltage VIN depending on time (t) at a specific temperature. As an example, the number of discharge units selected in the oscillators of FIGS. 1 and 4 are the same.

Referring to FIG. 5, $t_0$ represents the time at which a discharging operation of the discharge unit starts, and $V_{INT}$ represents the internal voltage VIN at the start time $t_0$ of the discharging operation. As illustrated in FIG. 5, the internal voltage VIN1 of the oscillator described above with reference to FIG. 1 is always higher than the internal voltage VIN2 of the oscillator described above with reference to FIG. 4.

It takes time $(t_2-t_0)$ for the oscillator of FIG. 1 to drop the internal voltage from $V_{INT}$ to VREF1, which is longer than the time $(t_1-t_0)$ for the oscillator of FIG. 4 to drop the internal voltage from $V_{INT}$ to VREF1. Therefore, the periodic signal generated by the oscillator of FIG. 1 has a longer period than a periodic signal generated by the oscillator of FIG. 4 under the same conditions of the reference voltage and the temperature.

Furthermore, during time $(t_1-t_0)$, the internal voltages of the oscillators of FIGS. 1 and 4 reach the levels of VREF1 and VREF2 (VREF2>VREF1), respectively. Therefore, the reference voltage of the oscillator of FIG. 1 should use a reference voltage higher than that of the oscillator of FIG. 4 for the same period of the periodic signals under the same temperature conditions.

The higher the reference voltage is, the worse the temperature-period change characteristics of the transistors included in the discharge unit become. The higher the reference voltage is, the less sensitive the period of the periodic signal becomes to changes in temperature. Thus, the oscillator of FIG. 4 may effectively generate periodic signal that are more responsive to changes in temperature.

Figure 6:
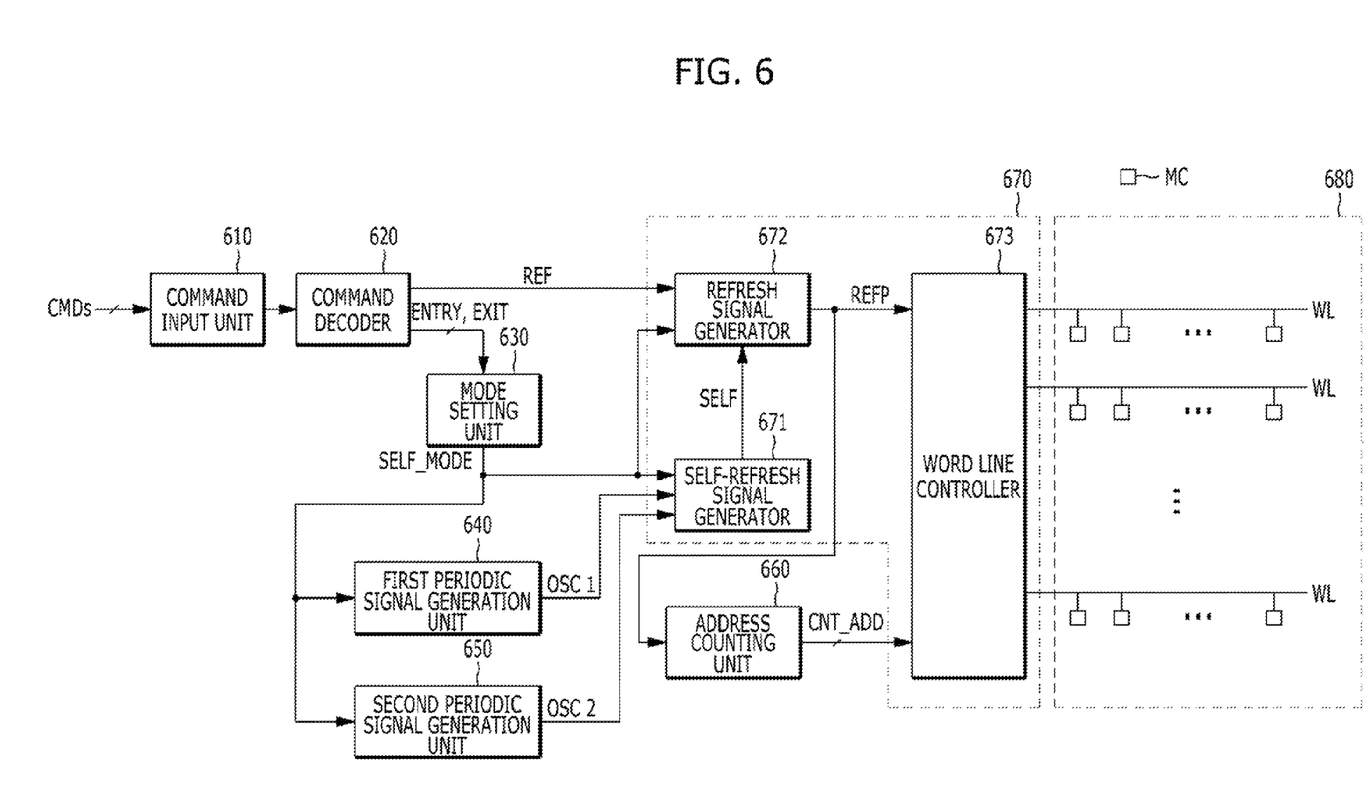
FIG. 6 is a block diagram illustrating a memory device in accordance with an exemplary embodiment of the present invention.

FIG. 6 is a block diagram illustrating a memory device in accordance with an exemplary embodiment of the present invention.

As illustrated in FIG. 6, the memory device may include a command input unit 610, a command decoder 620, a mode setting unit 630, a first periodic signal generation unit 640, a second periodic signal generation unit 650, an address counting unit 660, a control unit 670, and a cell array 680. The cell array 680 may include a plurality of word lines WL each coupled to one or more memory cells MC.

Referring to FIG. 6, the memory device will be described.

The command Input unit 610 may receive command signals CMDs. The command signals CMDs may include multi-bit signals. The command decoder 620 may decode the command signals CMDs received through the command input unit 610, and generate a refresh command REF, a self-refresh entry command ENTRY, and a self-refresh exit command EXIT. The command decoder 620 may enable a command indicated by a combination of the input command signals CMDs, among the refresh command REF, the self-refresh entry command ENTRY, and the self-refresh exit command EXIT.

The mode setting unit 630 may set a self-refresh mode of the memory device. The mode setting unit 630 may control the memory device to enter the self-refresh mode in response to the self-refresh entry command ENTRY, and control the memory device to exit from the self-refresh mode in response to the self-refresh exit command EXIT. For this operation, the mode setting unit 630 may enable a self-refresh mode signal SELF_MODE indicating the self-refresh mode in response to the self-refresh entry command ENTRY, and disable the self-refresh mode signal SELF_MODE in response to the self-refresh exit command EXIT.

The first periodic signal generation unit 640 may generate a first periodic signal OSC1 having a fixed period when the self-refresh mode signal SELF_MODE is enabled. The fixed period may be constant regardless of temperature changes in the memory device.

The second periodic signal generation unit 650 may generate a second periodic signal OSC1 having a period varying according to the temperature when the self-refresh mode signal SELF_MODE is enabled. The second periodic signal generation unit 640 may include the oscillator of FIG. 3 or 4. The self-refresh period may be determined according to the temperature, and the oscillator of FIG. 3 or 4 may adjust the self-refresh period thereof with more precision according to the temperature, thereby improving the characteristics of the self-refresh period of the memory device according to the temperature. The period of the second periodic signal OSC2 may become shorter as the temperature increases, or become longer as the temperature decreases. Although not illustrated in FIGS. 3 and 4, the comparison units 310 and 410 and the control unit 470 may receive the self-refresh mode signal SELF_MODE. The comparison units 310 and 410 and the control unit 470 may be activated to perform the above-described operations in response to the enabled self-refresh mode signal SELF_MODE, or may be deactivated in response to the disabled self-refresh mode signal SELF_MODE.

The control unit 670 may refresh the cell array 680 in response to the refresh command REF. In this case, the control unit 670 may refresh the cell array 680 according to the shorter period between the first and second periodic signals OSC1 and OSC2 in the self-refresh mode, when the self-refresh mode signal SELF_MODE is enabled.

For the above-described operations, the control unit 670 may include a self-refresh signal generator 671, a refresh signal generator 672, and a word line controller 673. When the self-refresh mode signal SELF_MODE is enabled, the self-refresh signal generator 671 may compare the first and second periodic signals OSC1 and OSC2, and enable a self-refresh signal SELF at the period corresponding to the periodic signal having a shorter period. For reference, the period of the self-refresh signal SELF may be equal to or divided from the shorter period between the first and second periodic signals OSC1 and OSC2. The refresh signal generator 672 may enable a refresh signal REFP in response to the refresh command REF. When the self-refresh mode signal SELF_MODE is enabled, the refresh signal generator 672 may enable the refresh signal REFP in response to the self-refresh signal SELF. When the refresh signal REFP is enabled, the word line controller 673 may refresh a word line WL corresponding to a counting address CNT_ADD.

The address counting unit 660 may generate the counting address CNT_ADD, and change the value of the counting address CNT_ADD whenever the refresh signal REFP is enabled. The address counting unit 660 may increase the value of the counting address CNT_ADD by 1 whenever the refresh signal REFP is enabled. When the value of the counting address CNT is increased by 1, it may indicate that the counting information is changed so that when a Kth word line WLK was selected at the previous time, a (K+1)th word line is selected this time.

When the memory device in not in the self-refresh mode, the memory device may sequentially refresh the plurality of word lines WL included in the cell array 380 in response to the refresh command REF. In the self-refresh mode, the memory device may sequentially refresh the plurality of word lines WL in response to the self-refresh signal SELF.

Figure 7:
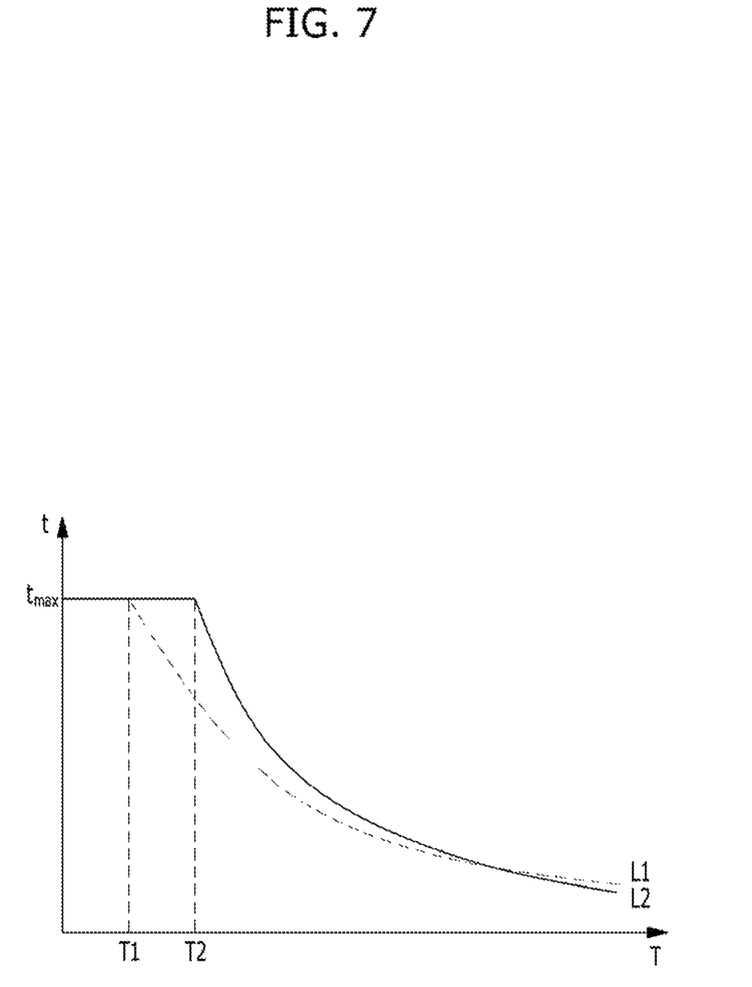
FIG. 7 is a temperature vs. refresh period graph Illustrating a memory device using oscillators shown in FIGS. 1 and 4.

FIG. 7 is a temperature vs. refresh period graph illustrating a memory device using oscillators respectively shown in FIGS. 1 and 4. FIG. 7 shows the self-refresh period (t) of the memory device depending on the temperature T.

Referring to FIG. 7, a first graph L1 Illustrates the self-refresh period according to the oscillator of FIG. 1, and a second graph L2 illustrates the self-refresh period according to the oscillator of FIG. 2.

The self-refresh period may be determined according to the period of the periodic signal having a shorter period between the first and second periodic signals OSC1 and OSC2 of FIG. 6. Thus, when the temperature of the memory device corresponds to a predetermined temperature $T_1$ or $T_2$, the self-refresh period may be determined by the first period signal OSC1. Thus, as indicated by $t_{max}$, the self-refresh period is constant below the predetermined temperature $T_1$ or $T_2$. However, when the temperature of the memory device becomes equal to or more than the predetermined time $T_1$ or $T_2$, the self-refresh period may be determined by the second periodic signal OSC2. Thus, the self-refresh period may decrease as the temperature increases.

In the case of the dotted line L1, the period change of the periodic signal OSC generated by the oscillator is relatively insensitive to temperature, that is, the slope of the period change is small. Thus, the period of the periodic signal OSC may be determined by the second periodic signal OSC2 from the relatively low temperature $T_1$. Therefore, the self-refresh period starts to become shorter from the relatively low temperature $T_1$.

In the case of the solid line L2, the period change of the periodic signal OSC generated by the oscillator is relatively sensitive to temperature, that is, the slope of the period change is large. Thus, the period of the periodic signal OSC may be determined by the second periodic signal OSC2 from the relatively high temperature $T_2$. Therefore, the self-refresh period starts to become shorter from the relatively low temperature $T_2$.

When the self-refresh period becomes shorter, current consumption and power consumption of the memory device, required to perform a refresh operation, may increase. Furthermore, when the self-refresh period is not sufficiently responsive to temperature, changes in retention time of the memory cell MC may not be compensated according to temperature and data may be lost. The memory device using the oscillator of FIG. 3 or 4 may properly change the self-refresh period according to temperature, thereby properly compensating for changes in retention time of the memory cell MC depending on the temperature change of the memory device, while at the same time minimizing current and power consumption.

Figure 8:
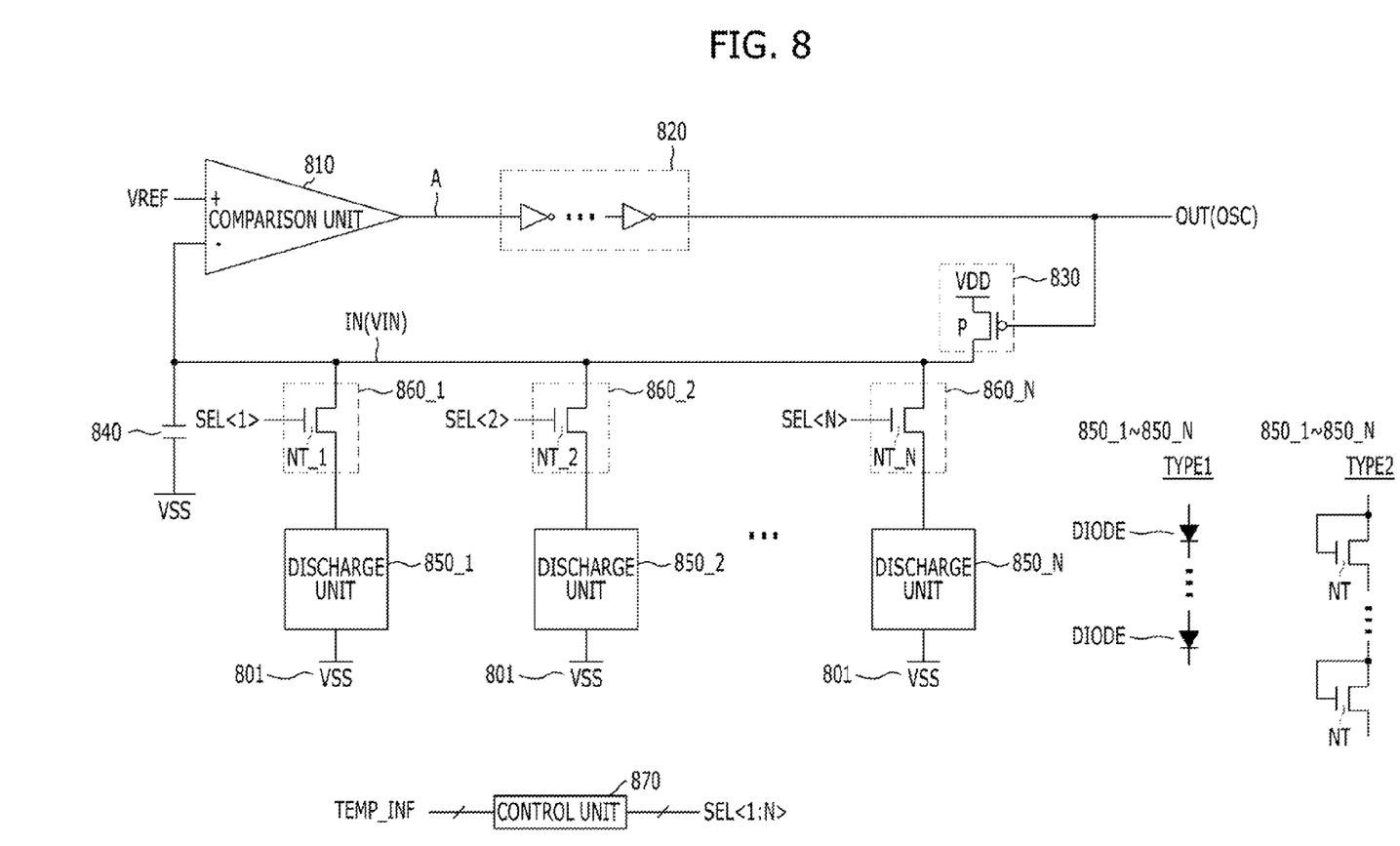
FIG. 8 is a circuit diagram illustrating an oscillator in accordance with an exemplary embodiment of the present invention.

FIG. 8 is a circuit diagram illustrating an oscillator in accordance with an exemplary embodiment of the present invention.

As illustrated in FIG. 8, the oscillator may include a comparison unit 810, an inverting unit 820, a pull-up driving unit 830, a capacitor 840, a plurality of discharge units 850_1 to 850_N, a plurality of selecting elements 860_1 to 860_N, and a control unit 870.

The comparison unit 810, the inverting unit 820, the pull-up driving unit 830, and the capacitor 840 may be configured and operated in the same manner as the comparison unit 110, the inverting unit 120, the pull-up driving unit 130, and the capacitor 140, which have been described with reference to FIG. 1.

The plurality of discharge units 850_1 to 850_N may be coupled to an internal node N. When each of the discharge units 850_1 to 850_N is selected, the discharge unit may discharge the capacitor 840 when the voltage of the internal node IN becomes higher than a predetermined voltage. Each of the discharge units 850_1 to 850_N may include one or more diodes DIODE coupled in series. At this time, each of the diodes DIODE may include the NMOS transistor NT of which the drain D and the gate G are coupled to each other. That is, each of the discharge units 850_1 to 850_N may be configured in such a manner as indicated by TYPE1 or TYPE2. The discharges of the discharge units 850_1 to 850_N to discharge the internal node IN may differ depending on the temperature. The plurality of discharge units 850_1 to 850_N may have the same relation between temperature and discharge, or one or more of the discharge units 850_1 to 850_N may have a different relation between temperature and discharge.

The plurality of selecting elements 860_1 to 860_N may be turned on when the corresponding discharge units 850_1 to 850_N are selected, and coupled between the corresponding discharge units 850_1 to 850_N and the internal node IN or coupled between the corresponding discharge units 850_1 to 850_N and a discharge terminal 801. FIG. 8 illustrates the case in which the plurality of selecting elements 860_1 to 860_N are NMOS transistors NT_1 to NT_N coupled between the corresponding discharge units 850_1 to 850_N and the internal node IN.

Figure 9A:
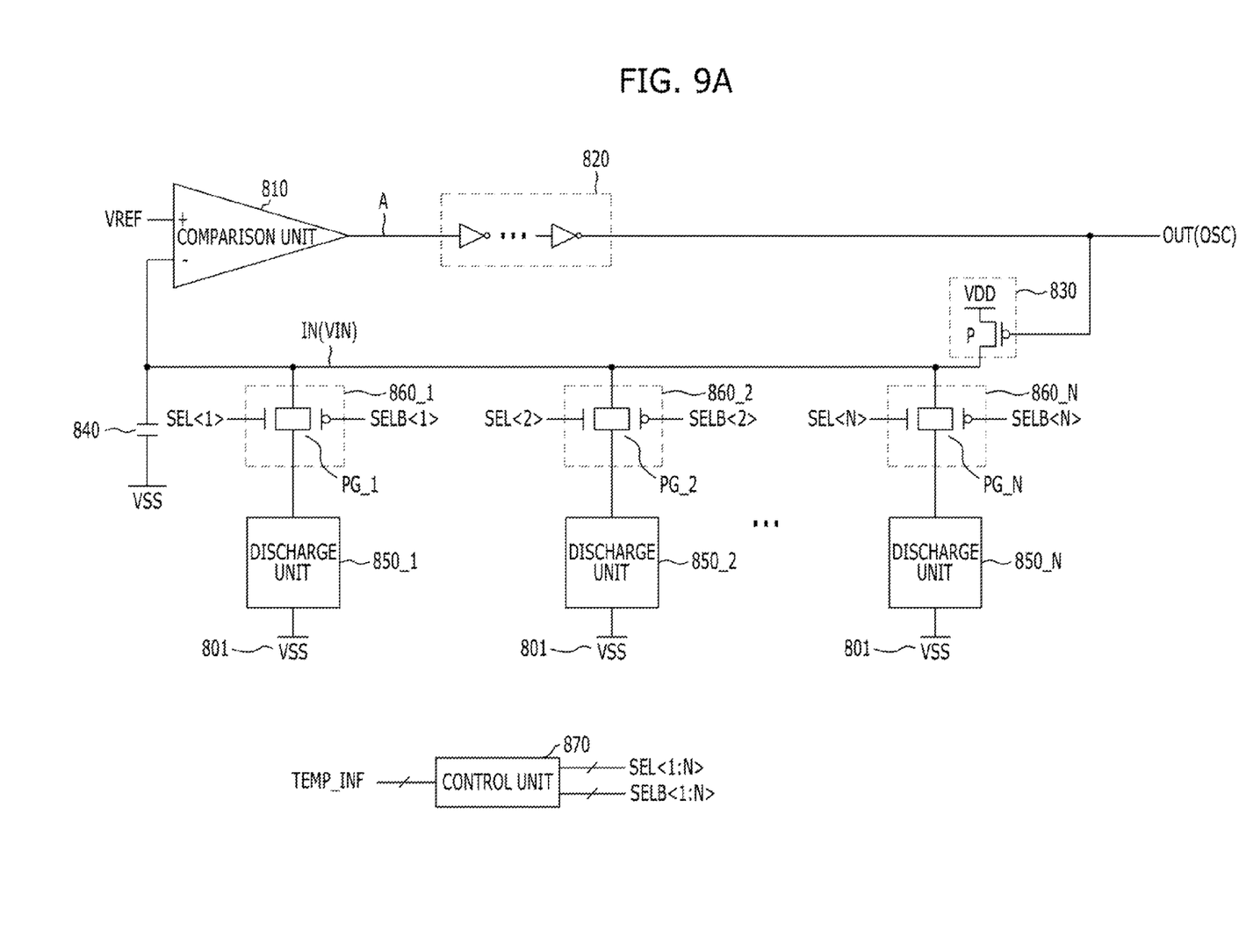
FIGS. 9A to 9C are circuit diagrams illustrating oscillators in accordance with exemplary embodiments of the present invention.
Figure 9B:
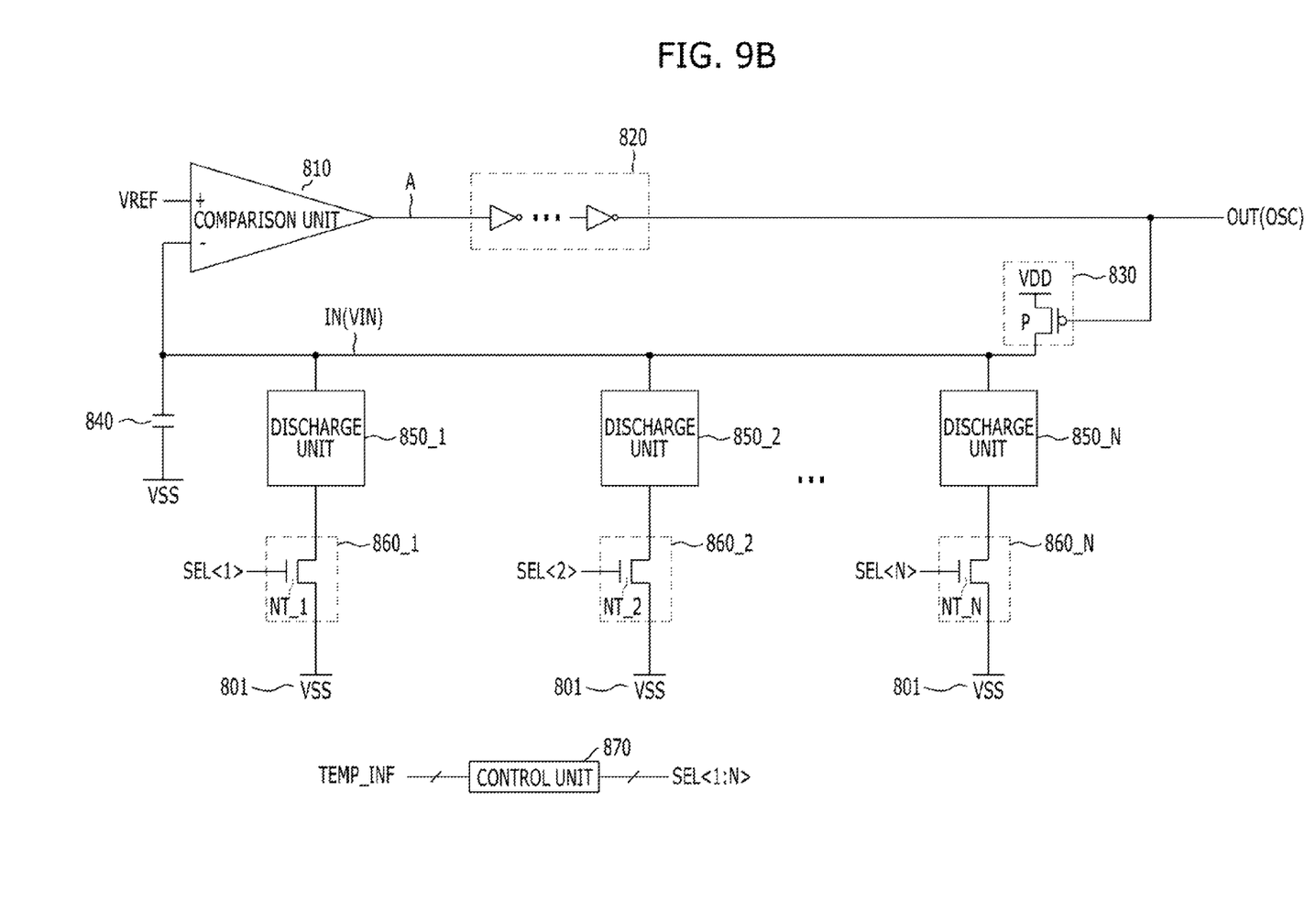
Figure 9C:
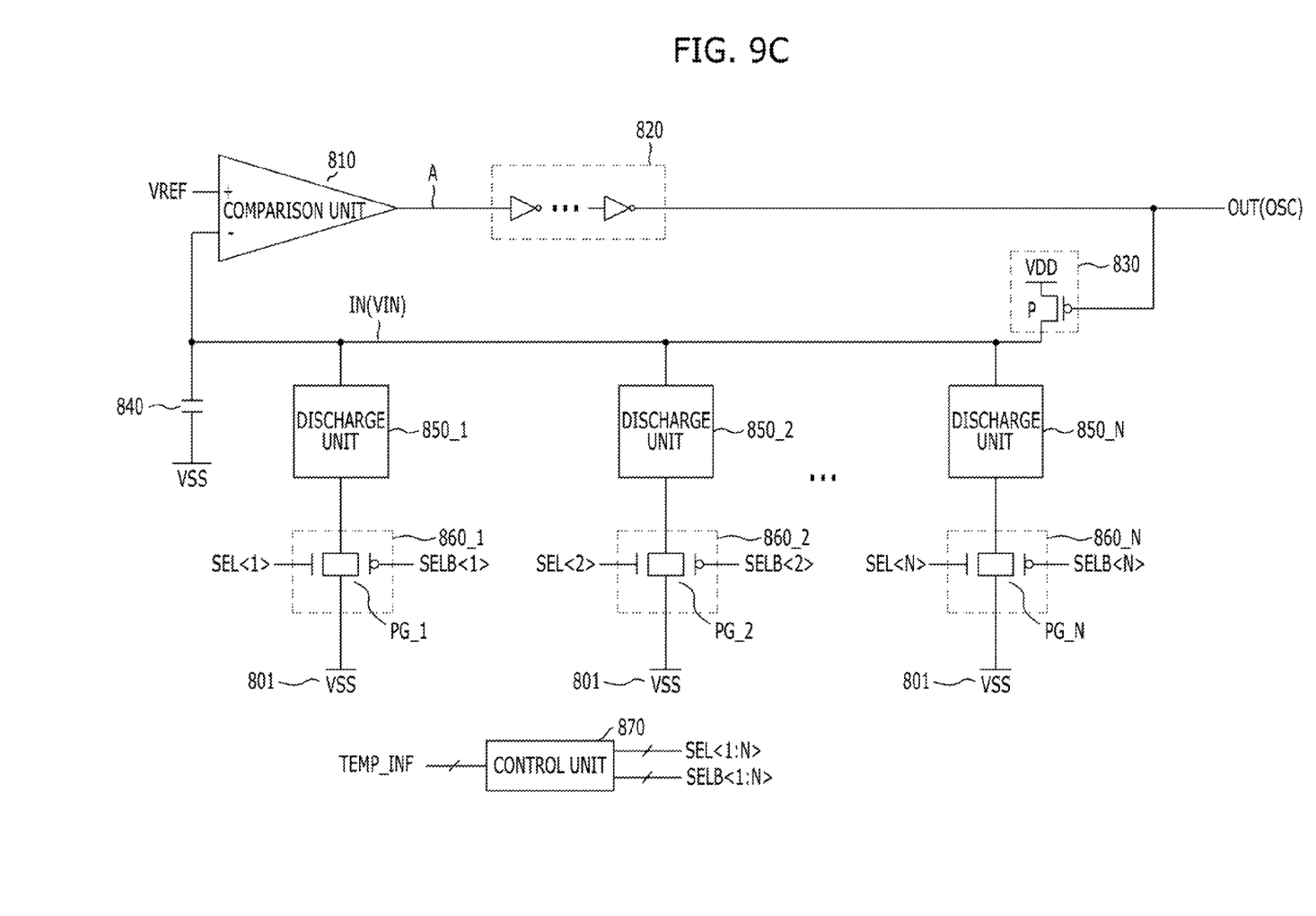

FIGS. 9A to 9C are circuit diagrams illustrating oscillators in accordance with exemplary embodiments of the present invention. The plurality of selecting elements 860_1 to 860_N may include pass gates PG_1 to PG_N coupled between the internal node IN and the corresponding discharge units 850_1 to 850_N as illustrated in FIG. 9A, NMOS transistors NT_1 to NT_N coupled between the discharge terminal 801 and the corresponding discharge units 850_1 to 850_N as illustrated in FIG. 9B, or pass gates PG_1 to PG_N coupled between the discharge terminal 801 and the corresponding discharge units 850_1 to 850_N as illustrated in FIG. 9C, respectively, depending on design. Alternatively, the plurality of selecting elements 860_1 to 860_N may include PMOS transistors coupled between the internal node IN and the corresponding discharge units 850_1 to 850_N or PMOS transistors coupled between the discharge terminal 801 and the corresponding discharge units 850_1 to 850_N, respectively. As such, the positions and types of the plurality of selecting elements may be designed in various manners.

The plurality of selecting elements 860_1 to 860_N may be turned on when the corresponding select signals among the plurality of select signals SEL<0:N> are enabled to the high level. When the plurality of selecting elements 860_1 to 860_N are turned on, the internal node IN may be discharged when the voltage of the internal node IN increases to a predetermined level or more. In FIGS. 9A and 9C, the select signals corresponding to the pass gates PG_1 to PG_N may include the select signals SEL<0:N> and select signals SELB<0:N> obtained by inverting the select signals SEL<0:N>. When the select signals SEL<0:N> are enabled, the select signals SEL<0:N> may have the high level, and when the select signals SELB<0:N> are enabled, the select signals SELB<0:N> may have the low level.

The control unit 870 may select one or more discharge units among the plurality of discharge units 850_1 to 850_N in response to temperature information TEMP_INF. The control unit 870 may enable select signals corresponding to discharge units selected among the plurality of discharge units 850_1 to 850_N. The control unit 870 may select a larger number of discharge units as the temperature increases or select a smaller number of discharge units as the temperature decreases, according to the temperature information TEMP_INF. For example, suppose that the oscillator includes three discharge units and reference temperatures are represented by T1 and T2 (T2>T1). Referring to the temperature information TEMP_INF, the control unit 870 may select only one discharge unit 850_1 when the current temperature is lower than the reference temperature T1, select two discharge units 850_1 and 850_2 when the current temperature is higher than the reference temperature T1 and lower than the reference temperature T2, or select three discharge units 850_1 to 850_3 when the current temperature is higher than the reference temperature T2.

Since the discharge ability of the diode DIODE differs depending on the temperature, the period of the periodic signal OSC outputted to the output node OUT may be changed according to the temperature. In particular, since the number of selected discharge units differs on the basis of the reference temperatures T1 and T2, the functional relation between the temperature and the period of the periodic signal OSC may differ at the left and right of the reference temperatures T1 and T2. For example, suppose that the oscillator includes three discharge units and the number of discharge units selected among three discharge units differs at the left and right of the reference temperatures T1 and T2. Therefore, the temperature-period function when the current temperature T is lower than the reference temperature T1 (T<T1), the temperature-period function when the current temperature is higher than the reference temperature T1 and lower than the reference temperature T2 (T2>T>T1), and the temperature-period function when the current temperature T is higher than the reference temperature (T>T2), may differ.

Through the above-described configuration and operation, the oscillator may adjust the period according to the temperature. The second periodic signal generation unit 640 of the memory device of FIG. 6 may include the oscillator of FIG. 8, 9A, 9B, or 9C. Using the oscillator, the memory device may divide the entire section into a plurality of sections (for example, section of T>T1, section of T2>T>T1, and section of T2<T), and properly adjust the self-refresh period in each section, according to the temperature.

In accordance with the embodiments of the present invention, the oscillator may effectively isolate capacitance generated by the internal components of the circuit, and generate a periodic signal which precisely oscillates at a period determined according to temperature.

Furthermore, the memory device may minimize power consumption while optimizing the self-refresh period according to temperature, using the above-described oscillator.

Although various embodiments have been described for illustrative purposes, it will be apparent to those skilled in the art that various changes and modifications may be made without departing from the spirit and scope of the invention as defined in the following claims.

What is claimed is:

1. An oscillator comprising:
   a comparison means suitable for generating a comparison signal by comparing an internal voltage of an internal node with a reference voltage;
   an inverting unit suitable for inverting the comparison signal and transmitting the inverted comparison signal to an output node;
   a pull-up driving unit suitable for pull-up driving the internal node in response to the voltage of the output node;
   a discharge unit suitable for discharging the internal node;
   a pass gate coupled between the internal node and the discharge unit, and turned on/off in response to the voltage of the output node wherein at least part of a capacitive load included in the oscillator is electrically coupled to the internal node, the pass gate comprising an NMOS transistor and a PMOS transistor that are electrically coupled in parallel; and
   a coupling unit electrically coupled between the discharge unit and a ground voltage, and operative in response to the voltage of the output node.

2. The oscillator of claim 1, wherein the inverting unit comprises an odd number of inverters coupled in series.

3. The oscillator of claim 1, wherein the discharge unit comprises one or more NMOS transistors coupled in series, and wherein each of the NMOS transistors serves as a diode.

4. The oscillator of claim 1, wherein the pull-up driving unit and the pass gate are alternately enabled in response to the voltage of the output node.

5. The oscillator of claim 1, wherein a discharge speed of the discharge unit decreases as a temperature thereof decreases, and increases as the temperature increases.

6. An oscillator comprising:
   a comparison means suitable for generating a comparison signal by comparing an internal voltage of an internal node with a reference voltage;
   an inverting unit suitable for inverting the comparison signal and transmitting the inverted comparison signal to an output node;
   a pull-up driving unit suitable for pull-up driving the internal node in response to the voltage of the output node;
   a selecting unit suitable for generating a control signal in response to select information and the voltage of the output node;
   a plurality of discharge units each operative in response to the control signal, and suitable for discharging the internal node;
   a plurality of pass gates coupled between the internal node and corresponding discharge units, of the plurality of discharge units, and turned on/off in response to the control signal, each of the plurality of the pass gates comprising an NMOS transistor and a PMOS transistor that are electrically coupled in parallel; and a plurality of coupling units electrically coupled between corresponding discharge units, of the plurality of discharge units, and a ground voltage, the plurality of coupling units to operate in response to the control signal, wherein at least part of a capacitive load of the oscillator is electrically coupled to the internal node.

7. The oscillator of claim 6, wherein the inverting unit comprises an odd number of inverters coupled in series.

8. The oscillator of claim 6,
wherein each of the discharge units comprises one or more NMOS transistors coupled in series, and wherein each of the NMOS transistors serves as a diode.

9. A memory device comprising:
a cell array comprising a plurality of memory cells;
a first signal generation unit suitable for generating a first signal having a fixed period;
a second signal generation unit suitable for generating a second signal having a variable period; and
a control unit suitable for refreshing the memory cells according to a shorter one between the fixed and variable periods in a self-refresh mode,
wherein the second signal generation unit comprises:
a plurality of discharge units suitable for discharging an internal node; and
a plurality of pass gates electrically coupled between the internal node and corresponding ones of the plurality of discharge units, each of the plurality of pass gates operative based on the second signal when a corresponding one of the plurality of discharge units is selected,
wherein the variable period corresponds to a speed at which the internal node is discharged by the selected one among the plurality of discharge units, and
wherein at least part of a capacitive load of the oscillator is electrically coupled to the internal node.

10. The memory device of claim 9, wherein each of the plurality of pass gates comprises an NMOS transistor and a PMOS transistor that are electrically coupled to each other in parallel.

11. The memory device of claim 9,
wherein a discharge speed of each of the plurality of discharge units decreases as a temperature thereof decreases, and increases as the temperature increases, and wherein the period of the second signal becomes longer as the temperature decreases, and becomes shorter as the temperature increases.

12. The memory device of claim 9, wherein the second signal generation unit further comprises:
a comparison unit suitable for generating a comparison signal by comparing an internal voltage of the internal node with a reference voltage; and
an inverting unit suitable for generating the second signal by inverting the comparison signal;
a pull-up driving unit suitable for pull-up driving the internal node according to the second signal; and
a selecting unit suitable for generating a control signal in response to select information and the second signal,
wherein the selected discharge unit is selected in response to the control signal.

13. The memory device of claim 9, wherein the control unit refreshes the memory cells in response to a refresh command, when the memory device is not in a self-refresh mode.

14. The memory device of claim 13, wherein the control unit comprises:
a self-refresh signal generator suitable for comparing the periods of the first and second signals and activating a self-refresh signal at a period corresponding to the signal having a shorter period between the first and second signals;
a refresh signal generator suitable for activating a refresh signal in response to the refresh command, and activating the refresh signal in response to the self-refresh signal in the self-refresh mode; and
a word line controller suitable for refreshing the memory cells when the refresh signal is enabled.

15. The memory device of claim 14, wherein the self-refresh signal generator transmits the signal having a shorter period between the first and second signals, as the self-refresh signal, or transmits a signal obtained by dividing the signal having a shorter period between the first and second signals, as the self-refresh signal.

16. The memory device of claim 9, wherein the inverting unit comprises an odd number of inverters coupled in series.

17. The memory device of claim 9, wherein each of the plurality of discharge units comprises a plurality of NMOS transistors coupled in series, and wherein each of the plurality of NMOS transistors functions as a diode.

* * * * *